United States Patent
Wisotzki

(10) Patent No.: US 11,037,917 B1
(45) Date of Patent: Jun. 15, 2021

(54) SEMICONDUCTOR DEVICE MODULE AND METHOD OF ASSEMBLY

(71) Applicant: Littelfuse, Inc., Chicago, IL (US)

(72) Inventor: Elmar Wisotzki, Darmstadt (DE)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 16/710,630

(22) Filed: Dec. 11, 2019

(51) Int. Cl.
| | |
|---|---|
| H01L 29/66 | (2006.01) |
| H01L 25/18 | (2006.01) |
| H01L 29/739 | (2006.01) |
| H01L 23/495 | (2006.01) |
| H01L 23/16 | (2006.01) |
| H01L 25/00 | (2006.01) |
| H01L 29/861 | (2006.01) |

(52) U.S. Cl.
CPC .............. *H01L 25/18* (2013.01); *H01L 23/16* (2013.01); *H01L 23/49562* (2013.01); *H01L 25/50* (2013.01); *H01L 29/7393* (2013.01); *H01L 29/861* (2013.01)

(58) Field of Classification Search
CPC .................................................. H01L 21/8249
See application file for complete search history.

(56) References Cited

U.S. PATENT DOCUMENTS

| | | | |
|---|---|---|---|
| 7,090,044 B2* | 8/2006 | Nakamura | B60L 15/007 180/65.8 |
| 10,727,268 B1* | 7/2020 | Xu | H04N 5/3745 |
| 2007/0266558 A1* | 11/2007 | Otremba | H01L 23/492 29/840 |
| 2012/0248564 A1* | 10/2012 | Hauenstein | H01L 23/34 257/467 |
| 2016/0086878 A1* | 3/2016 | Otremba | H01L 29/778 257/139 |
| 2017/0064808 A1* | 3/2017 | Rizza | H01L 25/50 |
| 2019/0097524 A1* | 3/2019 | Lin | H01L 23/66 |
| 2020/0373801 A1* | 11/2020 | Kinjo | H02P 25/18 |

* cited by examiner

*Primary Examiner* — Thao P Le
(74) *Attorney, Agent, or Firm* — Kacvinsky Daisak Bluni PLLC

(57) ABSTRACT

A semiconductor device module. The semiconductor device module may include a first substrate; and a semiconductor die assembly, disposed on the first substrate. The semiconductor die assembly may include a first semiconductor die, bonded to the first substrate; a second semiconductor die, disposed over the first semiconductor die; and an electrical connector, disposed between the first semiconductor die and the second semiconductor die, wherein the semiconductor die assembly comprises an insulated gate bipolar transistor (IGBT) die and a freewheeling diode die.

20 Claims, 7 Drawing Sheets

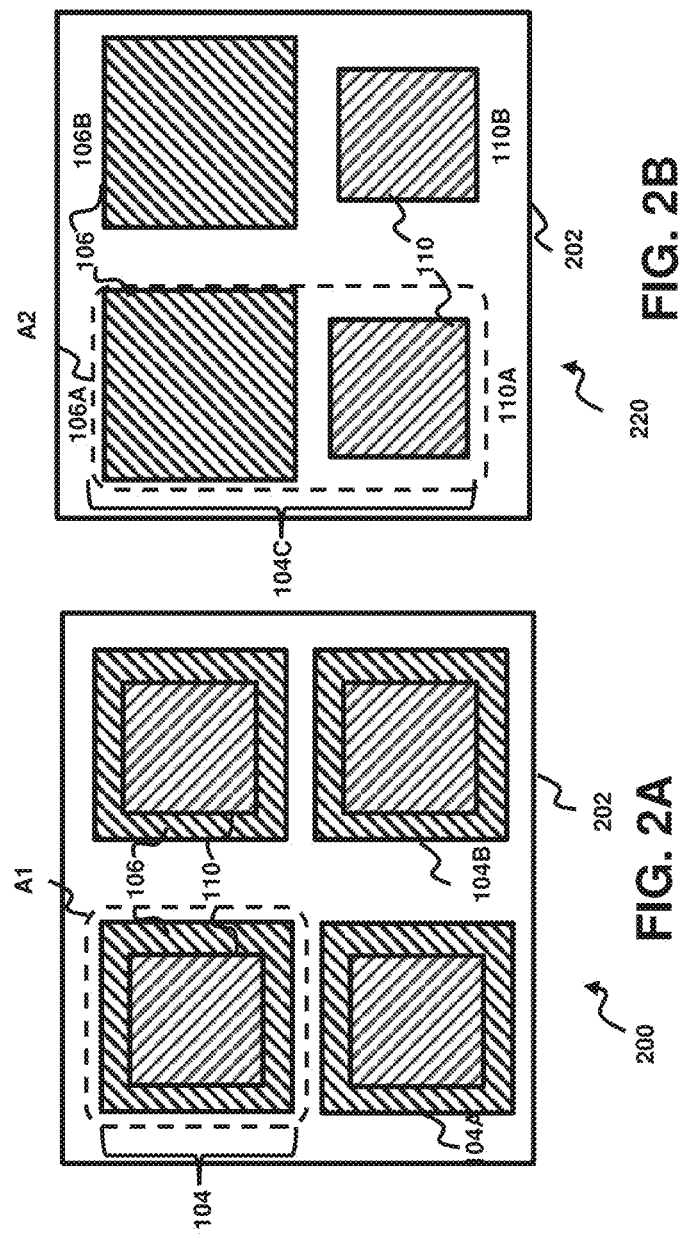

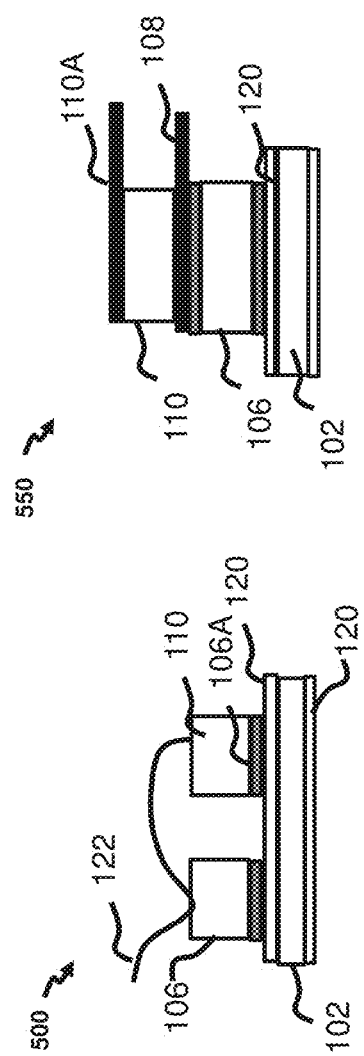

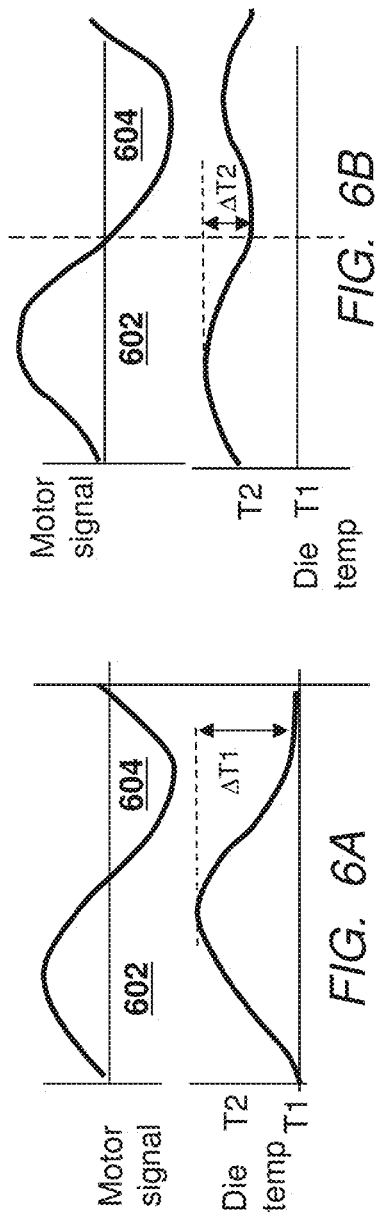
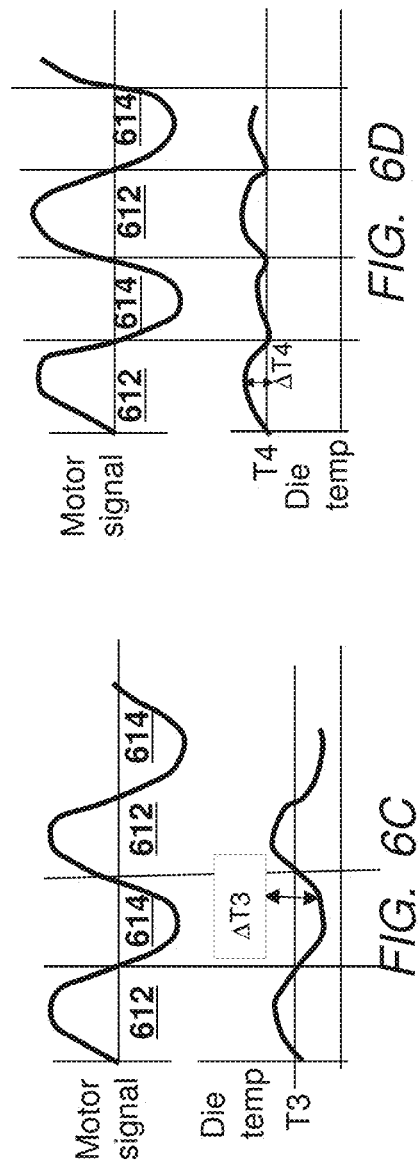

SEMICONDUCTOR DEVICE MODULE AND METHOD OF ASSEMBLY

BACKGROUND

Field

Embodiments relate to the field of semiconductor devices, and in particular, packages for power semiconductor chips.

Discussion of Related Art

In the present day, fast switching, power semiconductor devices normally employ fast switching diodes such as freewheeling diodes to protect the power semiconductor device from inductive loads, including motor coils or relay windings. At each instance of switching, where a switching device is turned "ON", the freewheel diode changes from a conducting state to a blocking state as it becomes reversed biased.

However, when the device rapidly turns "OFF", the freewheeling diode becomes forward biased and the collapse of the energy stored, for example, in a coil, causes a current to flow through the freewheel diode. Without the protection of the freewheeling diode, a high di/dt current may occur, causing a high voltage spike or transient to flow, and possibly damaging the switching device.

Accordingly, power semiconductor devices such as insulated gate bipolar transistors (IGBTs) are often arranged in power semiconductor modules, such as one or more substrates, such as 2, 4 or 6 substrates, similar to each other. Each substrate, including wires and resistors, hold pairs of IGBT die (chips) and diode chips, where one or more IGBT chips may be paired with a diode chip. This arrangement provides a modular manner to switch currents of a desirable amount by choosing the appropriate number of chips. Because the IGBT chips and diode chips are arranged in a planar configuration on a substrate, the substrates need to be sized to accommodate all of the chips, including wiring between chips. As such, power semiconductor modules may be unduly large in size to accommodate the required number of substrates and power semiconductor devices.

In view of the above, the present embodiments are provided.

BRIEF SUMMARY

In some embodiments, a semiconductor device module is provided. The semiconductor device module may include a first substrate; and a semiconductor die assembly, disposed on the first substrate. The semiconductor die assembly may include a first semiconductor die, bonded to the first substrate; a second semiconductor die, disposed over the first semiconductor die; and an electrical connector, disposed between the first semiconductor die and the second semiconductor die, wherein the semiconductor die assembly comprises an insulated gate bipolar transistor (IGBT) die and a freewheeling diode die.

In another embodiment, a method of forming a semiconductor device module, may include providing a first substrate and affixing a semiconductor die assembly to the first substrate. The semiconductor die assembly may include a first semiconductor die, bonded to the first substrate; a second semiconductor die, disposed over the first semiconductor die; and an electrical connector, disposed between the first semiconductor die and the second semiconductor die, wherein the first semiconductor die assembly comprises an insulated gate bipolar transistor (IGBT) die and a freewheeling diode die.

In an additional embodiment, a semiconductor device module may include a first substrate; and a semiconductor die assembly, disposed on the first substrate, the semiconductor die assembly comprising a stacked configuration of a first insulated gate bipolar transistor (IGBT) die and a freewheeling diode die, and an electrical connector, disposed between the IGBT die and the freewheeling diode semiconductor die. As such the IGBT die may be directly bonded to the first substrate, wherein the stacked configuration defines a first die area, equivalent to an area of the IGBT die.

BRIEF DESCRIPTION OF THE DRAWINGS

FIG. 2A illustrates a top plan view of another semiconductor device module according to additional embodiments of the disclosure;

FIG. 2B illustrates a top plan view of a reference semiconductor device module;

FIG. 5A depicts a side view of wiring for a reference device having a co-planar configuration of an IGBT and diode die;

FIG. 5B depicts a side view of wiring for a device according to the present embodiments;

FIG. 6A depicts a relatively lower frequency motor signal and resulting IGBT die temperature behavior for the reference device of FIG. 5A;

FIG. 6B depicts a relatively lower frequency motor signal and resulting die assembly temperature behavior for the device of FIG. 6A;

FIG. 6C depicts a relatively higher frequency motor signal and resulting IGBT die assembly temperature behavior for the device of FIG. 6A;

FIG. 6D depicts a relatively higher frequency motor signal and resulting die assembly temperature behavior for the device of FIG. 6B;

DESCRIPTION OF EMBODIMENTS

Figure 1A:
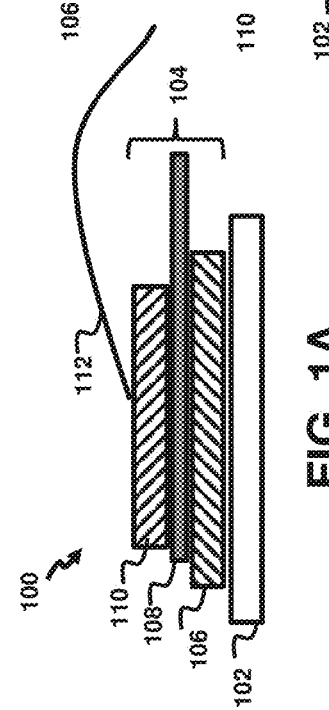
FIG. 1A shows a semiconductor device module in side view, in accordance with various embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

In various embodiments, a semiconductor device module and techniques for assembly are provided for power semiconductor devices.

Figure 1B:
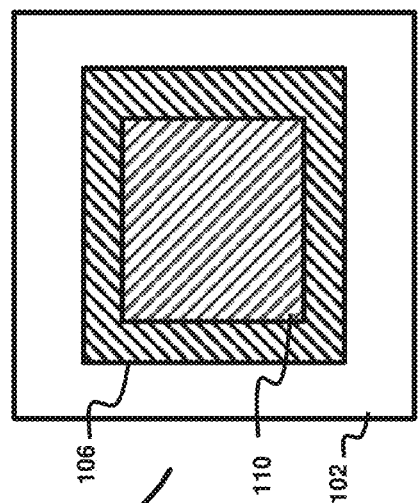
FIG. 1B illustrates a top plan view of the semiconductor device module of FIG. 1A.
Figure 1C:
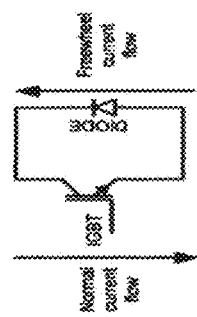
FIG. 1C illustrates a circuit representation of a semiconductor device module according to embodiments of the disclosure.

Turning to FIG. 1A there is shown a side view of a semiconductor device module 100, according to various embodiments of the disclosure. FIG. 1B shows a top plan view of a variant of the semiconductor device module 100. FIG. 1C illustrates an electrical circuit representation of the semiconductor device module 100. The semiconductor device module 100 includes a first substrate 102, a semiconductor die assembly 104, disposed on the first substrate 102. The first substrate 102 may be a known material stack such as copper/aluminum oxide/copper also known as DCB or DBC, according to some embodiments. As such, the first substrate may include an insulator body sandwiched between metallic layers, and may be referred to as an insulator substrate. The semiconductor die assembly 104 includes a first semiconductor die 106, attached to the first substrate 102, a second semiconductor die 110, disposed over the first semiconductor die 106, wire bonding 112, and an electrical connector 108, disposed between the first semiconductor die 106 and the second semiconductor die 110. In this embodiment and other embodiments of the disclosure, the semiconductor die assembly 104 includes an insulated gate bipolar transistor (IGBT) die and a freewheeling diode die. Generally, the IGBT die may be disposed in contact with the first substrate 102. As in known power device modules, an IGBT die may be coupled with a diode die, used as a freewheeling diode to protect the IGBT die. In other words, the first semiconductor die 106 may be an IGBT die, while the second semiconductor die 110 may be a freewheeling diode die. In various embodiments, the IGBT die, such as the first semiconductor die 106, is disposed over the first substrate 102 in a first region, and occupies a first area (in plan view, shown in FIG. 1B), while the freewheeling diode die, such as second semiconductor die 110, occupies a second area, less than the first area. In some non-limiting embodiments, the second area may be on the order of 50% of the first area, such as 40%-60%. Notably, the second semiconductor die 110 completely overlaps the first semiconductor die 106 as shown in plan view of FIG. 1B. As such, the semiconductor die assembly 104 is characterized by a stacked configuration of an IGBT die and a freewheeling diode die, in contrast to known semiconductor power module configurations, where IGBT die and diode die are each arranged directly on an substrate, in a co-planar configuration. Notably, various metallic layers (not shown) may be employed to bond the semiconductor die assembly 104 to first substrate 102, and to attach components within the semiconductor die assembly 104 to one another, such as by soldering.

Notably, as shown in FIG. 1C, the freewheeling diode die and IGBT die may be electrically coupled, wherein the freewheeling diode die is electrically coupled to the IGBT die as an inverse freewheeling diode.

In various embodiments, the stacked configuration of an IGBT die and freewheeling diode die may be provided on one or more substrates in a modular fashion. Thus, in various embodiments, the semiconductor die assembly 104 may represent just one of multiple semiconductor die assemblies within a given semiconductor device module. FIG. 2A illustrates a top plan view of another semiconductor device module according to additional embodiments of the disclosure. The semiconductor device module 200 includes four separate semiconductor die assemblies, where each semiconductor die assembly may be represented by semiconductor die assembly 104, described above. Thus, each additional semiconductor die assembly may disposed on a substrate 202, in a manner analogous to the configuration of the semiconductor die assembly 104, shown in FIG. 1A, where each additional semiconductor die assembly includes an insulated gate bipolar transistor (IGBT) die and a freewheeling diode die.

While a given freewheeling diode die directly lies over a given IGBT die within a semiconductor die assembly 104, the different semiconductor die assemblies do not overlap one another, as shown in FIG. 2A. Thus, a first semiconductor die assembly, shown as semiconductor die assembly 104A, is disposed on the substrate 202 in a first region, and a second semiconductor die assembly, shown as semiconductor die assembly 104B, is disposed on the substrate 202 in a second region, not overlapping the first region. Said differently, the different semiconductor die assembly of FIG. 2A are arranged in a coplanar fashion with one another.

To highlight the advantages of the semiconductor device module 200, FIG. 2B illustrates a top plan view of a reference semiconductor device module, shown as semiconductor device module 220. This reference semiconductor device module is arranged generally according to known power semiconductor device components. In this configuration, two different semiconductor die assemblies are arranged on the substrate 202. The semiconductor die assemblies are represented by semiconductor die assembly 104C, where the first semiconductor die 106 and second semiconductor die 110 for a given semiconductor die assembly 104C, but are arranged in a non-stacked configuration, or co-planar configuration with one another, rather than the stacked configuration of semiconductor die assembly 104. As shown in FIG. 2A, the substrate 202 is configured to accommodate the semiconductor die assembly 104 in a stacked configuration within a first substrate area, shown as A1. As shown in FIG. 2B, the same substrate is configured to accommodate the semiconductor die assembly 104C in a second substrate area, shown as A2, where the semiconductor die assembly 104C assembly contains the same semiconductor die as in semiconductor die assembly 104, arranged, however, in a non-stacked configuration. In accordance with various embodiments of the disclosure, the area A2 may be substantially larger than the area A1, such as at least 50% larger, and in some examples 100% larger. Said differently, the area A1, occupied by the semiconductor die assembly 104 of the present embodiments, may be 67% of the area A2, or in some examples just 50% of the area A2. Thus, a semiconductor device module arranged with the semiconductor die assembly 104 may be much more compact in area as compared to known semiconductor power device modules, for a given number of IGBT die. For example, as shown in FIG. 2A and FIG. 2B, the individual IGBT die, such as first semiconductor die 106, and the individual freewheeling diode die, such as second semiconductor die 110, may all be the same size, while the substrate 202 may be the same size in FIG. 2A and FIG. 2B. However, the substrate 202 of FIG. 2A may accommodate four IGBT die in a stacked configuration, while the substrate 202 accommodates just two IGBT die in the non-stacked arrangement of FIG. 2B.

Figure 3:
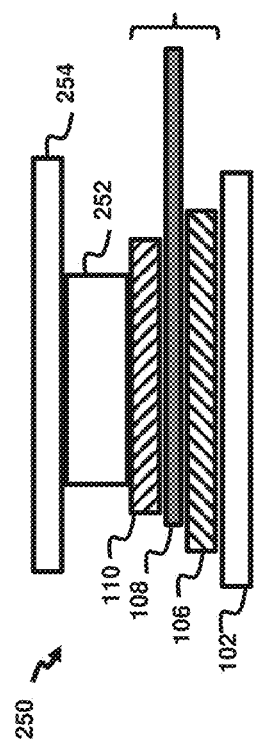
FIG. 3 shows another semiconductor device module in side view, in accordance with further embodiments of the disclosure.

While the aforementioned embodiments reflect so called single-side cooled device modules, in further embodiments, double-side cooled device modules are provided. FIG. 3 shows another semiconductor device module in side view, in accordance with further embodiments of the disclosure. In this embodiment the semiconductor device module 250, in addition to having the aforementioned components of semiconductor device module 100, includes a spacer 252, disposed over the semiconductor die assembly 104; and a second substrate 254, bonded to the spacer 252, where the spacer 252 is disposed between the semiconductor die assembly 104 and the second substrate 254. As such, the first substrate 102 and second substrate 254 may provide double sided cooling to the semiconductor die assembly 104.

In various additional embodiments, a plurality of semiconductor die assemblies 104 may be arranged between a first substrate 102 and second substrate 254, including the spacer 252.

Figure 4:
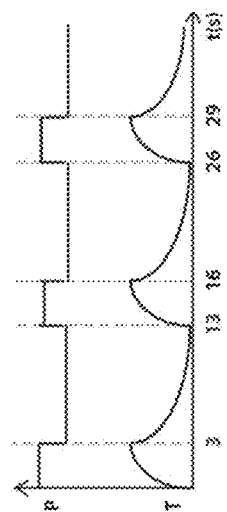
FIG. 4 illustrates electrical behavior during pulsing of a semiconductor device module, according to the present embodiments.

Another advantage provided by the stacked configuration of a semiconductor die assembly provided by the present embodiments is the improved thermal management resulting from the stacked configuration of diode and IGBT dies. FIG. 4 illustrates electrical behavior during pulsing of a semiconductor device module, according to the present embodiments. In the example shown, a series of regular power pulses are shown as a function of time, as well as the module temperature changes as a function of time. As illustrated, at the beginning of a pulse, a relatively rapid increase in temperature occurs, which increase may level off with time, depending upon the duration of the pulse. After the pulse terminates, a slower decrease in temperature may take place, which decrease may also level off with time, depending upon the duration of the OFF time between pulses. As such, the thermal swings may be characterized between highest and lowest temperature in one metric. According to the present embodiments, because the freewheeling diode is stacked directly over the IGBT, the overall temperature swing may be reduced for a given power switching level, in comparison to non-stacked configurations of known power modules, where the freewheeling diode is located away from the IGBT die.

To highlight the improvements in thermal swing provided by the present embodiments, FIG. 5A and FIG. 5B depict a reference configuration and a configuration according to the present embodiments for a device. In FIG. 5A there is shown a side view of wiring for a reference device 500, having a co-planar configuration of the first semiconductor die 106, in one implementation, an IGBT device, and a second semiconductor die 110, such as a diode die. A wire bond 122 is provided, connecting the IGBT device and diode die is series to ground. The first substrate 102 may be laminated with conductive layers 120, such as copper, coupled to outside voltage, on the opposite side of die from the wire bond.

FIG. 5B depicts a side view of wiring for a device 550, according to the present embodiments. In this example, the diode die (second semiconductor die 110) is stacked on top of the IGBT die (first semiconductor die 106). The electrical connector 108, disposed between the two die, is coupled to ground, while the top surface of the diode die and the bottom surface of the IGBT die (see conductive layer 120) are coupled to external voltage.

As is known, in operation, IGBTs may be used as high-speed switches, providing the ability to generate various type of output signals, including motor current, or sinewave type of output, at a much lower frequency than the switching speed. A pair of IGBT switches may operate in pulse width modulation (PWM) mode to generate an time varying output based on pulse width modulation. Current may be chopped between switch 1/diode 2 and switch 2/diode 1, for example, generating a motor signal, such as a current signal varying as a sine wave as a function of time. As the current varies with time the degree of heating generated at the IGBT die may vary accordingly. FIG. 6A depicts a relatively lower frequency motor signal, referred to herein for convenience as "low frequency," and resulting IGBT die temperature behavior for the reference device of FIG. 5A. The upper curve, represents the "motor signal" or current as a function of time, while the lower signal represents the IGBT die temperature as a function of time. In this example, the IGBT die temperature may vary from a value T1 to a maximum temperature, represented by the dashed line. In the first half cycle 602, the IGBT die heats up, while in the second half cycle 604, the IGBT die cools down. A temperature swing equal to $\Delta T1$ occurs, as shown.

FIG. 6B depicts a low frequency motor signal and resulting die assembly temperature behavior for the device of FIG. 5B. In this example, the motor signal may be assumed to be the same as in FIG. 6A. Because of the stacked configuration of die, the temperature of the die assembly of FIG. 5B tends to remain higher than the device of FIG. 5A, with a minimum temperature represented by T2. Notably, during the first half cycle 602, the IGBT die (first semiconductor die 106) heats up, while in the second half cycle 604, the IGBT die will tend to cool down. However, during the second half cycle 604, the second semiconductor die 110, that is, the diode die, is active. In other words, the second semiconductor die 110 is paired with another IGBT die (not shown), during the second half cycle 604, and accordingly generates additional heat, keeping the IGBT die of the device 550 warm, resulting in the second temperature peak shown in second half cycle 604. As a result, the overall temperature swing of the device assembly, including the first semiconductor die 106 and the second semiconductor die 110, is less, shown as $\Delta T2$. This lower temperature swing generates less thermal stress and may accordingly improve device reliability and longevity.

FIG. 6C depicts a relatively higher frequency motor signal, referred to herein as "higher frequency" signal and resulting IGBT die assembly temperature behavior for the reference device of FIG. 5A. In this example, a first half cycle 612 and a second half cycle 614 are shown. The frequency of the motor signal in this example, is postulated to be much higher than the frequency in the example of FIG. 6A, such as double the frequency. Notably, the temperature behavior of the IGBT device is qualitatively similar to the behavior of FIG. 6A, with a temperature swing of $\Delta T3$ about an average temperature of T3. Thus, the IGBT device heats above the average temperature in the first half cycle 612 and cools below the average temperature in the second half cycle 614.

FIG. 6D depicts a higher frequency motor signal and resulting die assembly temperature behavior for the device of FIG. 5B. Again, because the second semiconductor die 110 is active during the second half cycle 614, the temperature shows a second peak in this period, and the overall temperature swing is reduced, shown as ΔT4.

Notably, at ultralow frequency the number of power cycles doubles in the stacked configuration of the present embodiments. Generally, the PWM of the phase legs is sine-modulated to shape a sine motor current. Thus, in an arrangement where a first transistor/diode pair is coupled with a second transistor/diode pair, for one half period ("+ wave") the current toggles between a second transistor die in a second transistor/diode stack (T2) and a first diode die in a first transistor/diode pair (D1), whereas a second diode die in the second transistor/diode pair (D2) and a first transistor die in the first transistor/diode pair (T1) are not conducting current. In the second half period ("– wave") T2 and D1 are off and D2 and T1 are conducting. When the motor current frequency is very low (e.g., ~10 Hz) the temperature of the conducting semiconductor follows the current. As frequency is very low, the non-current conducting semiconductors have sufficient time to cool down to the heatsink temperature. Thus, in the "+ wave" portion T2 and D1 will see a full temperature swing, while the temperature of D2 and T1 drop to the heatsink temperature. In the "– wave" portion, T1 and D2 will see a full temperature swing, while the temperature of D1 and T2 drop to the heatsink temperature. In the present embodiments, if D2 is stacked with T2, then T2 heats up the stack during the "+ wave" and, though T2 is not powered during "– wave" T2 will be heated by D2, which die is powered during "– wave". In this manner, the frequency of the temperature swing experienced by a transistor/diode stack doubles, and in the frequency range where the thermal capacity acts as a filter the dT will be reduced, resulting in lower stress.

Figure 7:
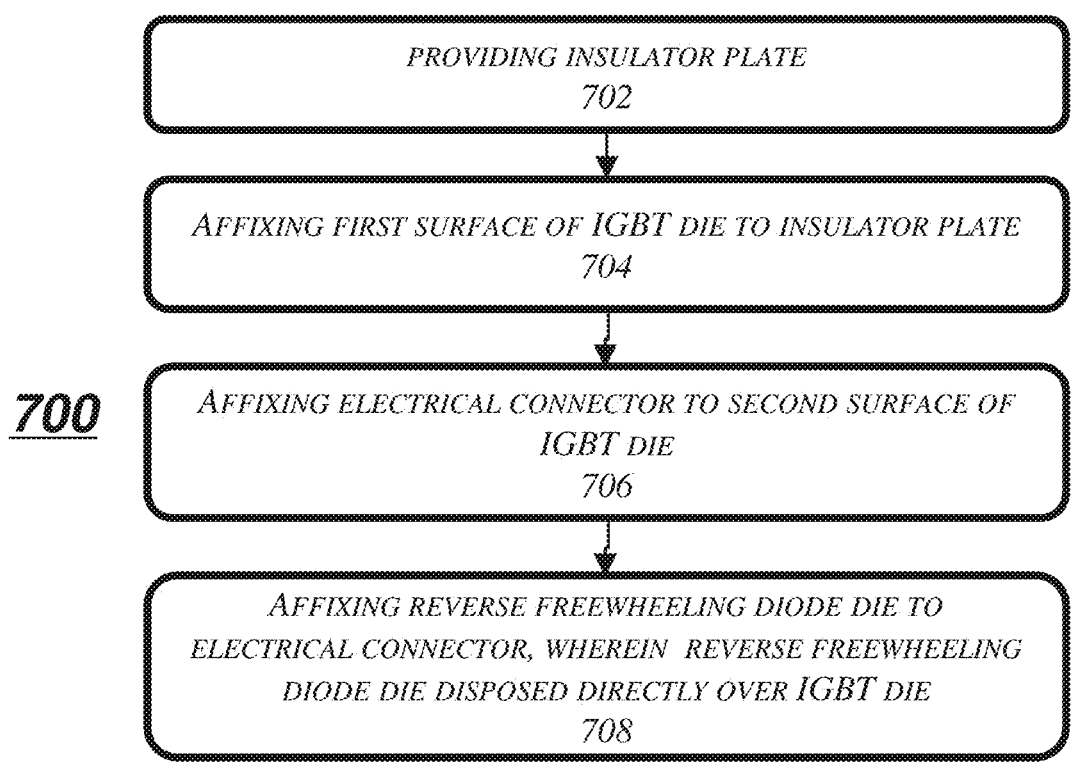
FIG. 7 depicts a process flow, according to embodiments of the disclosure.

FIG. 7 depicts a process flow 700, according to embodiments of the disclosure. At block 702 a substrate is provided. The main portion of the substrate may be a known material such as aluminum oxide, aluminum nitride, and so forth, according to various non-limiting embodiments, and may include conductive layers, such as known "DCB/DBC" (direct copper bond/direct bond copper substrates).

At block 704, a first surface of an IGBT die is affixed to the substrate. The IGBT may be bonded to the substrate using a suitable known metallurgy according to known techniques.

At block 706, an electrical connector or lead, is affixed to a second surface of the IGBT die, opposite the first surface. In particular, a first connector lead may be connected to an "Emitter" contact area of the IGBT die while a $2^{nd}$ connector lead is attached to a gate contact of the IGBT.

At block 708, a reverse freewheeling diode die is affixed above the electrical connector, such as the first connector lead, where the reverse freewheeling diode die is disposed directly over the IGBT die. In various embodiments, the reverse freewheeling diode die has a smaller area than the area of the IGBT die and accordingly may entirely overlap with the IGBT die. In various embodiments, the reverse freewheeling diode die may be centered above the IGBT die.

According to variants of the process flow 700, the process flow may be implemented with multiple IGBT die and multiple reverse freewheeling diode die, where a given IGBT die and given reverse freewheeling diode die form a given semiconductor die assembly, such that multiple freewheeling diode die are assembled upon a given insulator substrate.

Figure 8:
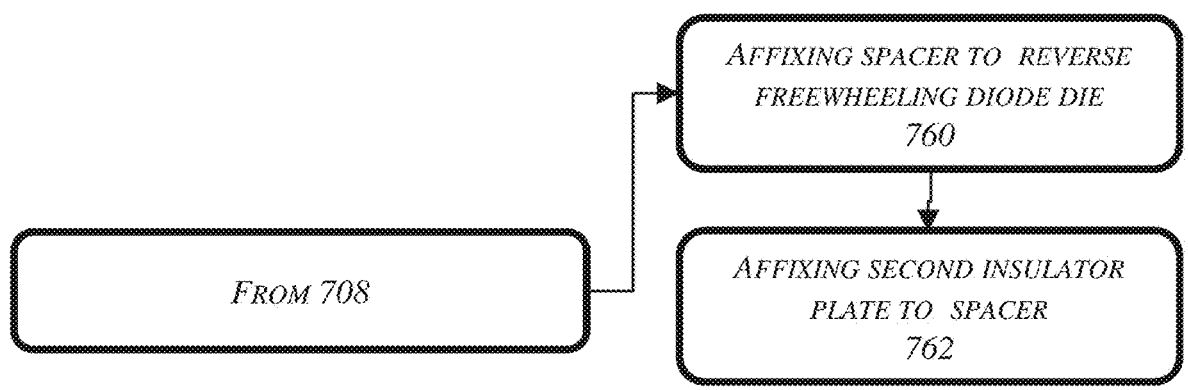
FIG. 8 depicts another process flow, according to additional embodiments of the disclosure.

FIG. 8 depicts another process flow, shown as process flow 750, according to additional embodiments of the disclosure. The process flow 750 may proceed generally as in the process flow 700, through block 702, block 704, block 706, and block 708. After block 708, at block 760, a spacer is affixed to the reverse freewheeling diode die. The spacer may be chosen from known spacer materials for IGBT modules. The thickness of the spacer may be chosen for suitable isolation.

Subsequently to block 760, at block 762, a second substrate is affixed to the spacer. The second substrate may be affixed to the spacer on a second surface of the spacer, opposite a first surface of the spacer that is used to bond to the reverse freewheeling diode die. Depending upon the exact design requirements the second substrate may be the same as or different from a first substrate, provided at block 702, discussed above.

According to variants of the process flow 750, the process flow may be implemented with multiple IGBT die and multiple reverse freewheeling diode die, where a given IGBT die and given reverse freewheeling diode die form a given semiconductor die assembly, such that multiple freewheeling diode die are assembled between two insulator substrates.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.).

What is claimed is:

1. A semiconductor device module, comprising:
a first substrate; and
a semiconductor die assembly, disposed on the first substrate, the semiconductor die assembly comprising:
a first semiconductor die, bonded to the first substrate;
a second semiconductor die, disposed over the first semiconductor die; and
an electrical connector, disposed between the first semiconductor die and the second semiconductor die,
wherein the semiconductor die assembly comprises an insulated gate bipolar transistor (IGBT) die and a freewheeling diode die.

2. The semiconductor device module of claim 1, wherein the IGBT die is directly bonded to the first substrate.

3. The semiconductor device module of claim 2, wherein the IGBT die comprises a first area and is disposed over the first substrate in a first region, and the freewheeling diode die comprises a second area, less than the first area, and is disposed in the first region.

4. The semiconductor device module of claim 1, wherein the freewheeling diode die is electrically coupled to the IGBT die as an inverse diode.

5. The semiconductor device module of claim 1, further comprising:
a spacer, disposed over the semiconductor die assembly; and
a second substrate, bonded to the spacer, wherein the spacer is disposed between the semiconductor die assembly and the second substrate.

6. The semiconductor device module of claim 1, wherein the semiconductor die assembly is a first semiconductor die assembly, the semiconductor device module further comprising;
a second semiconductor die assembly, disposed on the first substrate, and comprising:
a third semiconductor die, bonded to the first substrate;

a fourth semiconductor die, disposed over the third semiconductor die; and an electrical connector, disposed between the third semiconductor die and the fourth semiconductor die, wherein the second semiconductor die assembly comprises an insulated gate bipolar transistor (IGBT) die and a freewheeling diode die.

7. The semiconductor device module of claim 6, wherein the first substrate is an insulator substrate, wherein the first semiconductor die assembly is disposed on the insulator substrate in a first region, wherein the second semiconductor die assembly is disposed on the first substrate in a second region, not overlapping the first region, and wherein the first semiconductor die assembly is arranged in a coplanar fashion with the second semiconductor die assembly.

8. The semiconductor device module of claim 6, the first semiconductor die assembly further comprising:

a spacer, disposed over the first semiconductor die assembly and the second semiconductor die assembly; and a second substrate, bonded to the semiconductor die assembly, wherein the spacer is disposed between the semiconductor die assembly and the second substrate.

9. The semiconductor device module of claim 1, further comprising at least one additional semiconductor die assembly, disposed on the substrate, wherein the semiconductor die assembly comprises a stacked configuration of the IGBT die and the freewheeling diode die, wherein each additional semiconductor die assembly of the at least one additional semiconductor die assembly comprises a stacked configuration of an additional IGBT die and an additional freewheeling diode die, wherein the first substrate is configured to accommodate the semiconductor die assembly in a stacked configuration within a first substrate area, and is configured to accommodate the at least one additional semiconductor die assembly within a second substrate area, wherein in a non-stacked configuration, a given IGBT die and given freewheeling diode die of a given semiconductor die assembly are each bonded directly to the first substrate.

10. The semiconductor device module of claim 1, the semiconductor die assembly comprising a stacked semiconductor die assembly, arranged as a stacked configuration of the IGBT die and the freewheeling diode die, wherein the stacked semiconductor die assembly is configured to reduce a temperature swing during current pulsing in comparison to a non-stacked configuration of a semiconductor die assembly, wherein a given IGBT die and given freewheeling diode die are each bonded directly to the first substrate.

11. A method of forming a semiconductor device module, comprising:

providing a first substrate; and affixing a semiconductor die assembly to the first substrate, the semiconductor die assembly comprising:

a first semiconductor die, bonded to the first substrate;

a second semiconductor die, disposed over the first semiconductor die; and an electrical connector, disposed between the first semiconductor die and the second semiconductor die, wherein the first semiconductor die assembly comprises an insulated gate bipolar transistor (IGBT) die and a freewheeling diode die.

12. The method of claim 11, comprising bonding the IGBT die directly bonded to the first substrate.

13. The method of claim 12, wherein the IGBT die comprises a first area and is disposed over the first substrate in a first region, and the freewheeling diode die comprises a second area, less than the first area, and is disposed in the first region.

14. The method of claim 11, comprising electrically coupling the freewheeling diode die to the IGBT die as an inverse diode configuration.

15. The method of claim 11, further comprising:

arranging a spacer over the semiconductor die assembly; and affixing a second substrate to the spacer, wherein the spacer is disposed between the semiconductor die assembly and the second substrate.

16. The method of claim 11, wherein the semiconductor die assembly is a first semiconductor die assembly, the method further comprising;

affixing a second semiconductor die assembly, over the first substrate, the second semiconductor die assembly comprising:

a third semiconductor die, bonded to the first substrate;

a fourth semiconductor die, disposed over the third semiconductor die; and an electrical connector, disposed between the third semiconductor die and the fourth semiconductor die, wherein the second semiconductor die assembly comprises another IGBT die and another freewheeling diode die.

17. The method of claim 16, wherein the first substrate is a first insulator substrate, the method further comprising arranging the first semiconductor die assembly in a coplanar fashion with the second semiconductor die assembly, on the first insulator substrate.

18. A semiconductor device module, comprising:

a first substrate; and a semiconductor die assembly, disposed on the first substrate, the semiconductor die assembly comprising a stacked configuration of a first insulated gate bipolar transistor (IGBT) die and a freewheeling diode die, and an electrical connector, disposed between the IGBT die and the freewheeling diode semiconductor die, wherein the IGBT die is directly bonded to the first substrate, and wherein the stacked configuration defines a first die area, equivalent to an area of the IGBT die.

19. The semiconductor device module of claim 18, further comprising:

a spacer, disposed over the semiconductor die assembly; and a second substrate, bonded to the spacer, wherein the spacer is disposed between the semiconductor die assembly and the second substrate.

20. The semiconductor device module of claim 18, wherein the first substrate is configured to accommodate the semiconductor die assembly in a first area A1, wherein when the IGBT die and the freewheeling diode die are arranged in a non-stacked configuration on the first substrate, the first substrate is configured to accommodate the IGBT die and the freewheeling diode die in an area A2, wherein the area A2 is at least 50% larger than A1.

* * * * *